US011345639B2

United States Patent
Hidaka et al.

(10) Patent No.: US 11,345,639 B2
(45) Date of Patent: *May 31, 2022

(54) COMPOSITE SINTERED BODY, ELECTROSTATIC CHUCK MEMBER, ELECTROSTATIC CHUCK DEVICE, AND METHOD FOR PRODUCING COMPOSITE SINTERED BODY

(71) Applicant: SUMITOMO OSAKA CEMENT CO., LTD., Tokyo (JP)

(72) Inventors: Nobuhiro Hidaka, Tokyo (JP); Naoto Kimura, Tokyo (JP)

(73) Assignee: SUMITOMO OSAKA CEMENT CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/981,089

(22) PCT Filed: Mar. 22, 2019

(86) PCT No.: PCT/JP2019/012059
§ 371 (c)(1),
(2) Date: Sep. 15, 2020

(87) PCT Pub. No.: WO2019/182107
PCT Pub. Date: Sep. 26, 2019

(65) Prior Publication Data
US 2021/0114937 A1   Apr. 22, 2021

(30) Foreign Application Priority Data

Mar. 22, 2018 (JP) .............................. JP2018-055209

(51) Int. Cl.
*C04B 35/117* (2006.01)
*C04B 35/505* (2006.01)
(Continued)

(52) U.S. Cl.
CPC .......... *C04B 35/117* (2013.01); *C04B 35/505* (2013.01); *C04B 35/6265* (2013.01);
(Continued)

(58) Field of Classification Search
CPC .. C04B 35/117; C04B 35/505; H01L 21/6833
See application file for complete search history.

(56) References Cited

U.S. PATENT DOCUMENTS

2003/0123213 A1   7/2003   Kosakai
2019/0019713 A1*  1/2019   Hidaka ................. C04B 35/103
(Continued)

FOREIGN PATENT DOCUMENTS

JP   H05-295352 A   11/1993
JP   H06-157140 A   6/1994
(Continued)

OTHER PUBLICATIONS

International Search Report for PCT/JP2019/012059 (dated Jun. 4, 2019).
(Continued)

*Primary Examiner* — Karl E Group
(74) *Attorney, Agent, or Firm* — Merchant & Gould P.C.

(57) ABSTRACT

A ceramic composite sintered body, including: a metal oxide as a main phase, and silicon carbide as a sub-phase, in which crystal grains of the silicon carbide are dispersed in crystal grains of the metal oxide and at crystal grain boundaries of the metal oxide, and an average crystal grain size of the silicon carbide dispersed at the crystal grain boundaries of the metal oxide is 0.30 μm or less.

10 Claims, 2 Drawing Sheets

(51) Int. Cl.
  *H01L 21/683* (2006.01)
  *C04B 35/626* (2006.01)
  *C04B 35/645* (2006.01)

(52) U.S. Cl.
  CPC ...... *C04B 35/62625* (2013.01); *C04B 35/645* (2013.01); *H01L 21/6833* (2013.01); *C04B 2235/3826* (2013.01); *C04B 2235/549* (2013.01); *C04B 2235/785* (2013.01); *C04B 2235/85* (2013.01)

(56) References Cited

U.S. PATENT DOCUMENTS

| | | | |
|---|---|---|---|
| 2019/0043746 A1* | 2/2019 | Yoshioka | C04B 35/117 |
| 2020/0027770 A1* | 1/2020 | Hidaka | H02N 13/00 |
| 2020/0211884 A1* | 7/2020 | Hidaka | H01L 21/68757 |

FOREIGN PATENT DOCUMENTS

| | | |
|---|---|---|
| JP | 08-267305 A | 10/1996 |
| JP | 08-267305 B | 10/1996 |
| JP | 2003-152065 A | 5/2003 |
| JP | 2005-306635 A | 11/2005 |
| JP | 2008-127258 A | 6/2008 |
| JP | 2010-525930 A | 7/2010 |
| JP | 4744855 B2 | 8/2011 |
| WO | 2017/131159 A1 | 8/2017 |
| WO | 2018/155374 A1 | 8/2018 |
| WO | 2018/181130 A1 | 10/2018 |
| WO | 2019-004402 A1 | 1/2019 |

OTHER PUBLICATIONS

International Search Report for PCT/JP2018/012039 (dated Jun. 19, 2018).

* cited by examiner

COMPOSITE SINTERED BODY, ELECTROSTATIC CHUCK MEMBER, ELECTROSTATIC CHUCK DEVICE, AND METHOD FOR PRODUCING COMPOSITE SINTERED BODY

This application is a U.S. National Stage Application under 35 U.S.C. § 371 of International Patent Application No. PCT/JP2019/012059, filed on Mar. 22, 2019, which claims priority to Japanese Patent Application No. 2018-055209 filed in Japan on Mar. 22, 2018, the disclosures of all of which are hereby incorporated by reference in their entireties.

TECHNICAL FIELD

The present invention relates to a composite sintered body, an electrostatic chuck member, an electrostatic chuck device, and a method for producing a composite sintered body.

The present application claims priority based on Japanese Patent Application No. 2018-055209 filed in Japan on Mar. 22, 2018, and the content thereof is incorporated herein.

BACKGROUND

In a semiconductor manufacturing apparatus which performs a plasma process, an electrostatic chuck device in which a plate-shaped sample (a wafer) can be easily mounted on and fixed to a sample stage and it is possible to maintain a temperature of the wafer at a desired temperature is used. The electrostatic chuck device is provided with an electrostatic attraction electrode that generates an electrostatic force (Coulomb's force) between a base having one main surface which is a placing surface on which the wafer is placed, and the wafer placed on the placing surface (refer to, for example, Patent Literature No. 1). The base is usually made of a ceramic sintered body as a forming material.

In such an electrostatic chuck device, the wafer is fixed by using the electrostatic force generated between the wafer and the electrostatic attraction electrode. Specifically, in the electrostatic chuck device, when fixing the wafer, voltage is applied to the electrostatic attraction electrode to generate an electrostatic force between the wafer and the electrostatic attraction electrode. On the other hand, when removing the wafer fixed to the placing surface in the electrostatic chuck device, the application of the voltage to the electrostatic attraction electrode is stopped to make the electrostatic force between the wafer and the electrostatic attraction electrode disappear.

CITATION LIST

Patent Literature

[Patent Literature No. 1] Japanese Patent No. 4744855

SUMMARY OF INVENTION

Technical Problem

Incidentally, in a semiconductor manufacturing apparatus, gas corrosion or damage (plasma erosion) of constituent members occurs. There is a problem in that the quality of a device deteriorates due to the resulting fine particles (particles). For example, if fine particles fall onto a circuit during a semiconductor manufacturing process, a defect such as circuit breakage may occur, causing a decrease in yield.

Members which are used in the electrostatic chuck device which is used in the semiconductor manufacturing apparatus are also required to suppress the generation of particles.

The present invention has been made in view of such circumstances and has an object to provide a composite sintered body for an electrostatic chuck in which the generation of particles is suppressed. Further, the present invention has an object to provide an electrostatic chuck member and an electrostatic chuck device using such a composite sintered body. Further, the present invention has an object to provide a method for producing a composite sintered body, which allows such a composite sintered body to be easily produced.

Solution to Problem

The present invention includes the following [1] to [11].

[1] A ceramic composite sintered body, including: a metal oxide as a main phase, and silicon carbide as a sub-phase, in which crystal grains of the silicon carbide are dispersed in crystal grains of the metal oxide and at crystal grain boundaries of the metal oxide, and an average crystal grain size (D50) of the silicon carbide dispersed at the crystal grain boundaries of the metal oxide is 0.30 µm or less.

[2] The composite sintered body according to the above [1], in which an average crystal grain size (D50) of the silicon carbide dispersed in the crystal grains of the metal oxide is 0.20 µm or less.

[3] The composite sintered body according to the above [1] or [2], in which a proportion of the crystal grains of the silicon carbide dispersed in the crystal grains of the metal oxide is 40% or more in an area ratio, based on total crystal grains of the silicon carbide.

[4] The composite sintered body according to any one of the above [1] to [3], in which the metal oxide is aluminum oxide or yttrium oxide.

[5] The composite sintered body according to any one of the above [1] to [4], in which an average crystal grain size of the metal oxide is 1.2 µm or more and 10 µm or less.

[6] An electrostatic chuck member including: a plate-shaped base made of the composite sintered body according to any one of the above [1] to [5], which is used as a forming material, wherein the plate-shaped base having one main surface serving as a mounting surface on which a plate-shaped sample is mounted; and an electrostatic attraction electrode provided on a side opposite to the mounting surface of the base, or in an inside of the base.

[7] An electrostatic chuck device including: the electrostatic chuck member according to the above [6].

[8] A method for producing a composite sintered body including: a step of mixing metal oxide particles, silicon carbide particles, and a dispersion medium; a step of adjusting pH of slurry obtained in the mixing step to a range in which surface charges of the metal oxide particles in the slurry is positive and surface charges of the silicon carbide particles in the slurry is negative; a step of forming a formed body after removing the dispersion medium from the slurry having the adjusted pH; and a step of pressure-sintering the obtained formed body by heating the formed body to a temperature of 1600° C. or higher while compacting the formed body at a pressure of 25 MPa or more under a non-oxidative atmosphere, in which the mixing step is a step of charging the metal oxide particles, the silicon carbide, the dispersion medium and a dispersive medium in a dispersion stirring mill and mixing them.

[9] The method for producing a composite sintered body according to the above [8], further including: a step of oxidizing a surface of the silicon carbide particle, prior to the mixing step.

[10] The method for producing a composite sintered body according to the above [8] or [9], in which in the pH adjusting step, the pH of the slurry is adjusted to 5 or more and 7 or less.

[11] The method for producing a composite sintered body according to any one of the above [8] to [10], in which a metal oxide content of the metal oxide particles is 99.99% or more.

Advantageous Effects of Invention

According to the present invention, it is possible to provide a composite sintered body for an electrostatic chuck in which the generation of particles is suppressed. Further, it is possible to provide an electrostatic chuck member and an electrostatic chuck device using such a composite sintered body. Further, it is possible to provide a method for producing a composite sintered body, which allows such a composite sintered body to be easily produced.

DESCRIPTION OF EMBODIMENTS

Hereinafter, a preferred example of an electrostatic chuck device according to the present embodiment will be described with reference to FIG. 1. The following description is specific description for better understanding of the gist of the invention, and does not limit the invention unless otherwise specified. The number, position, size, numerical value, and the like can be changed, omitted, or added within a scope which does not depart from the present invention. Further, in all the following drawings, in order to make the drawings easy to see, all or some of the dimensions, ratios, and the like of each constituent element are appropriately changed.

[Electrostatic Chuck Device]

Figure 1:
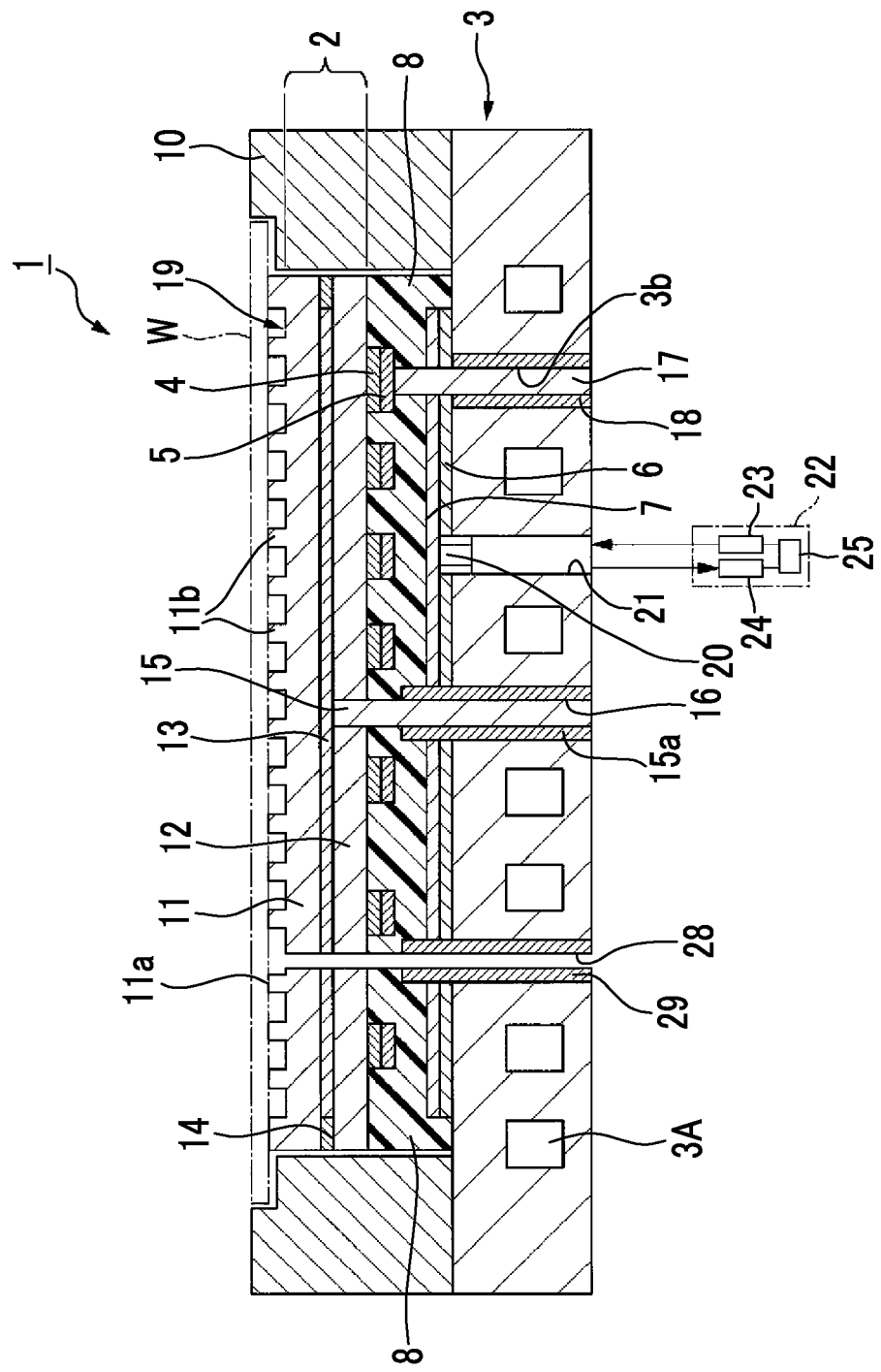
FIG. 1 is a schematic sectional view showing an electrostatic chuck device of the present embodiment.

FIG. 1 is a sectional view showing an electrostatic chuck device of the present embodiment. An electrostatic chuck device 1 of the present embodiment includes an electrostatic chuck part 2 and a temperature adjusting base part 3. The electrostatic chuck part 2 has a disk shape when viewed in a plan view and has a mounting surface on the one main surface (upper surface) side. The temperature adjusting base part 3 is a member having a thick disk shape when viewed in a plan view and provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a placing plate 11, a supporting plate 12, an electrostatic attraction electrode 13 provided between the placing plate 11 and the supporting plate 12, and an insulating material layer 14 which insulates the surroundings of the electrostatic attraction electrode 13. The placing plate 11 has an upper surface serving as a mounting surface 11a on which a plate-shaped sample W such as a semiconductor wafer is placed. The supporting plate 12 is integrated with the placing plate 11 and supports the bottom portion side of the placing plate 11. Each of the placing plate 11 and the supporting plate 12 corresponds to a "base" in the present invention.

The placing plate 11 and the supporting plate 12 are disk-shaped members in which the shapes of superimposed surfaces are the same. Each of the placing plate 11 and the supporting plate 12 is made of a ceramic sintered body having mechanical strength and durability against corrosive gas and plasma thereof. The material for forming the placing plate 11 and the supporting plate 12 will be described in detail later.

A plurality of projection portions 11b each having a diameter smaller than the thickness of the plate-shaped sample are formed at predetermined intervals on the mounting surface 11a of the placing plate 11, and the projection portions 11b support the plate-shaped sample W.

The thickness of the entirety including the placing plate 11, the supporting plate 12, the electrostatic attraction electrode 13, and the insulating material layer 14, that is, the thickness of the electrostatic chuck part 2 can be optionally selected. However, as an example, it is 0.7 mm or more and 5.0 mm or less.

For example, if the thickness of the electrostatic chuck part 2 falls below 0.7 mm, there is a case where it becomes difficult to secure the mechanical strength of the electrostatic chuck part 2. If the thickness of the electrostatic chuck part 2 exceeds 5.0 mm, the thermal capacity of the electrostatic chuck part 2 increases, and thus the thermal responsiveness of the plate-shaped sample W placed thereon deteriorates, and due to an increase in the heat transfer in a lateral direction of the electrostatic chuck part, there is a case where it becomes difficult to maintain the in-plane temperature of the plate-shaped sample W at a desired temperature pattern. The thickness of each part described here is an example and is not limited to the range described above.

The electrostatic attraction electrode 13 is used as an electrostatic chucking electrode for generating electric charges and fixing the plate-shaped sample W with an electrostatic attraction force. The shape or size thereof is appropriately adjusted according to the use of the electrode.

The electrostatic attraction electrode 13 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited. However, for example, the thickness of 0.1 μm or more and 100 μm or less can be selected, and the thickness of 5 μm or more and 20 μm or less is more preferable.

If the thickness of the electrostatic attraction electrode 13 falls below 0.1 μm, there is a case where it becomes difficult to secure sufficient electrical conductivity. If the thickness of the electrostatic attraction electrode 13 exceeds 100 μm, cracking easily occurs in the joint interfaces between the electrostatic attraction electrode 13, and the placing plate 11 and the supporting plate 12 due to a difference in coefficient of thermal expansion between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof, and joins and integrates a boundary portion between the placing plate 11 and the supporting plate 12, that is, an outer peripheral portion region except for the electrostatic attraction electrode 13. The insulating material layer 14 is formed of an insulating material having the same composition or the same main component as the material configuring the placing plate 11 and the supporting plate 12.

(Temperature Adjusting Base Part)

The temperature adjusting base part 3 is for adjusting the temperature of the electrostatic chuck part 2 to a desired temperature and has a thick disk shape. As the temperature adjusting base part 3, for example, a liquid-cooling base or the like, in which a flow path 3A for circulating a refrigerant is formed in the interior thereof, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is made of a sheet-shaped or film-shaped adhesive resin having heat resistance and insulation properties, such as polyimide resin, silicone resin, or epoxy resin. The adhesion layer is formed in a thickness in a range of about 5 to 100 μm, for example. The insulating plate 7 is made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulation properties, such as alumina.

(Focus Ring)

A focus ring 10 is a member that has a ring shape when viewed in a plan view and is placed on a peripheral portion of the temperature adjusting base part 3. The focus ring 10 is formed of, for example, a material having electrical conductivity equivalent to that of the wafer which is placed on the mounting surface. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulation properties is provided on the outer periphery side of the power supply terminal 15, and the power supply terminal 15 is insulated from the temperature adjusting base part 3 made of metal, by the insulator 15a.

In the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. Therefore, it is favorable if, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is preferable that the portion is made of a conductive ceramic material such as $Al_2O_3$—TaC.

The portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. As the heater element 5, a non-magnetic metal thin plate having a constant thickness of 0.2 mm or less, preferably about 0.1 mm can be given as an example, and the shape thereof can also be optionally selected. The heater element 5 can be obtained, for example, by processing a titanium (Ti) thin plate, a tungsten (W) thin plate, a molybdenum (Mo) thin plate, or the like into a desired heater shape, for example, a shape in which a band-like conductive thin plate meanders and the entire contour is an annular shape, by a photolithography method or laser processing.

The heater element 5 may be provided by bonding a non-magnetic metal thin plate to the electrostatic chuck part 2 and then processing and forming the non-magnetic metal thin plate on the surface of the electrostatic chuck part 2. Alternatively, the heater element 5 processed and formed at a position different from the electrostatic chuck part 2 may be provided by transfer-printing it onto the surface of the electrostatic chuck part 2.

The heater element 5 is bonded and fixed to the bottom surface of the supporting plate 12 by an adhesion layer 4 which is made of a sheet-shaped or film-shaped silicone resin or acrylic resin having a uniform thickness and having heat resistance and insulation properties.

A power supply terminal 17 for supplying electric power to the heater element 5 is connected to the heater element 5.

As the material configuring the power supply terminal 17, the same material as the material configuring the power supply terminal 15 described above can be used. The power supply terminal 17 is provided so as to pass through a through-hole 3b formed in the temperature adjusting base part 3. A tubular insulator 18 having insulation properties is provided on the outer periphery side of the power supply terminal 17.

Further, a temperature sensor 20 is provided on the lower surface side of the heater element 5. In the electrostatic chuck device 1 of the present embodiment, an installation hole 21 is formed so as to penetrate the temperature adjusting base part 3 and the insulating plate 7 in the thickness direction, and the temperature sensor 20 is installed at the uppermost portion of the installation hole 21. It is preferable that the temperature sensor 20 is installed at a position as close to the heater element 5 as possible. Therefore, the installation hole 21 may be formed to extend so as to protrude further toward the adhesive layer 8 side from the structure shown in the drawing such that the temperature sensor 20 and the heater element 5 are brought closer to each other.

The temperature sensor 20 is, for example, a fluorescent emission type temperature sensor in which a phosphor layer is formed on the upper surface side of a rectangular parallelepiped-shaped light transmission body made of quartz glass or the like. The temperature sensor 20 is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, a wide variety of fluorescent materials can be selected. As the material for forming the phosphor layer, a fluorescent material to which a rare earth element having an energy level suitable for light emission is added, a semiconductor material such as AlGaAs, metal oxide such as magnesium oxide, and a mineral such as ruby or sapphire can be given as an example. The forming material can be used by being appropriately selected from these materials.

The temperature sensor 20 corresponding to the heater element 5 is provided at any position which does not interfere with the power supply terminal or the like and is in a circumferential direction of the lower surface of the heater element 5.

A temperature measurement part 22 which measures the temperature of the heater element 5 from the fluorescence of the temperature sensor 20 can be optionally selected. However, the following configuration can be given as an example. The temperature measurement part 22 can be configured to include an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater, based on the fluorescence.

Further, the electrostatic chuck device 1 has a gas hole 28 provided so as to penetrate from the temperature adjusting base part 3 to the placing plate 11 in the thickness direction thereof. A tubular insulator 29 is provided at an inner peripheral portion of the gas hole 28.

A gas supply device (cooling means) (not shown) is connected to the gas hole 28. Cooling gas (heat transfer gas) for cooling the plate-shaped sample W is supplied from the gas supply device through the gas hole 28. The cooling gas is supplied to grooves 19 which are formed between the plurality of projection portions 11b on the upper surface of the placing plate 11 through the gas hole, and cools the plate-shaped sample W.

Further, the electrostatic chuck device 1 has a pin insertion hole (not shown) provided so as to penetrate from the temperature adjusting base part 3 to the placing plate 11 in the thickness direction thereof. The pin insertion hole can adopt the same configuration as that of the gas hole 28, for example. A lift pin for removal of the plate-shaped sample is inserted into the pin insertion hole.

The electrostatic chuck device 1 has the configuration as described above.

(Composite Sintered Body)

Next, the base (each of the placing plate 11 and the supporting plate 12) of the present embodiment will be described in detail.

Each of the placing plate 11 and the supporting plate 12 of the present embodiment is formed of a ceramic composite sintered body which includes a metal oxide, which is a main phase, and silicon carbide, which is a sub-phase.

In the composite sintered body of the present embodiment, the crystal grains of the silicon carbide are dispersed in the crystal grains of the metal oxide and at the crystal grain boundaries of the metal oxide.

The average crystal grain size of the silicon carbide dispersed in the crystal grains of the metal oxide is preferably 0.20 µm or less.

The average crystal grain size of the silicon carbide dispersed at the crystal grain boundaries of the metal oxide is 0.30 µm or less.

The silicon carbide is easily eroded by a fluorine gas or the like, comparted to the metal oxide. For this reason, during wafer-less dry cleaning which is a cleaning process in a semiconductor manufacturing apparatus, if radicals, ions, or the like of a fluorine-based gas or the like come into contact with the composite sintered body that is a base of a positively charged chuck, the silicon carbide is eroded and fine particles (particles) are generated.

In the present embodiment, the crystal grains of the silicon carbide are dispersed not only at the crystal grain boundaries of the metal oxide but also in the crystal grains of the metal oxide. The metal oxide has higher gas corrosion resistance than the silicon carbide. Therefore, the incorporation of the silicon carbide into the crystal grains makes it difficult for the fluorine-based gas to come into contact with the silicon carbide, so that erosion can be prevented and the generation of particles can be prevented. In this way, it is possible to prevent the occurrence of a defect such as circuit breakage due to the generation of particles, or a decrease in yield.

Average Crystal Grain Size of Silicon Carbide Dispersed in Crystal Grains of Metal Oxide The average crystal grain size (D50) of the silicon carbide dispersed in the crystal grains of the metal oxide is preferably 0.20 µm or less, more preferably 0.18 µm or less, further preferably 0.16 µm or less, and particularly preferably 0.15 µm or less. The lower limit of the grain size can be optionally selected. However, as an example of the lower limit value, for example, 0.01 µm can be given.

Average Crystal Grain Size of Silicon Carbide Dispersed at Crystal Grain Boundaries of Metal Oxide The average crystal grain size (D50) of the silicon carbide dispersed at the crystal grain boundaries of the metal oxide is 0.30 µm or less, preferably 0.29 µm or less, more preferably 0.285 µm or less, and particularly preferably 0.28 µm or less.

The lower limit of the grain size can be optionally selected. However, as an example of the lower limit value, for example, 0.05 µm can be given.

In the present embodiment, the silicon carbide can be dispersed in the crystal grains of the metal oxide by using fine silicon carbide at the time of production such that the average gain size of the silicon carbide is the specific grain size described above or less.

If the average crystal grain size of the silicon carbide particles is equal to or smaller than the specific grain size, since the silicon carbide particles cannot follow the movement of the grain boundary of the metal oxide in a sintering step, the silicon carbide particles easily stay in the metal oxide. As a result, the silicon carbide can be dispersed in the crystal grains of the metal oxide.

(Method of Measuring Average Crystal Grain Size of Metal Oxide and Average Crystal Grain Size of Silicon Carbide)

The average crystal grain size of the metal oxide and the average crystal grain size of the silicon carbide, which are included in a composite oxide, can be measured by the following method.

Measurement Method

The surface of the composite oxide (sintered body) is mirror-polished with diamond paste, and then thermal etching is performed.

The surface of the obtained sintered body is microscopically observed at a magnification of 10,000 times by using a scanning electron microscope (model number: S-4000 manufactured by Hitachi High-Technology Co., Ltd.).

The electron micrograph is incorporated into image analysis type particle size distribution measurement software (Mac-View Version 4) to calculate the major axis diameters of 200 or more metal oxide crystal grains. The arithmetic average value of the obtained major axis diameters of the crystal grains is defined as an "average crystal grain size" of the metal oxide to be obtained.

The obtained electron micrograph is incorporated into image analysis type particle size distribution measurement software (Mac-View Version 4) to calculate the major axis diameters of the crystal grains of 200 or more silicon carbide particles. The arithmetic average value of the obtained major axis diameters of the crystal grains is defined as an "average crystal grain size" of the silicon carbide particles to be obtained.

The proportion of the silicon carbide in the entire composite sintered body is preferably 8% by mass or less. It is more preferably 7% by mass or less, and further preferably 6% by mass or less. The lower limit value of the silicon carbide can be optionally selected. However, an example thereof is 1% by mass or more. If necessary, the proportion may be in a range of 1% by mass to 3% by mass, in a range of 3% by mass to 5% by mass, or in a range of 5% by mass to 8% by mass.

As the metal oxide of the composite sintered body of the present embodiment, it can be optionally selected. However, for example, at least one of aluminum oxide and yttrium oxide can be preferably used.

In the composite sintered body of the present embodiment, the average crystal grain size of the metal oxide can be optionally selected. However, it is preferably 1.2 µm or more and 10 µm or less.

In the composite sintered body, the average crystal grain size of the metal oxide is 1.2 µm or more, whereby a sufficient insulation effect can be exhibited without excessively lowering the resistivity of the particle itself of the metal oxide. Further, the average crystal grain size of the metal oxide is 10 µm or less, whereby the mechanical strength of the obtained sintered body becomes sufficiently high, and thus damage (chipping) does not easily occur.

In the composite sintered body, the average crystal grain size of the metal oxide can be adjusted by controlling a sintering temperature. If the sintering temperature increases, the average crystal grain size of the metal oxide tends to become large, and if the sintering temperature is lowered, the average crystal grain size of the metal oxide tends to become small.

Further, in the composite sintered body of the present embodiment, the crystal grains of the silicon carbide are dispersed in the crystal grains of the metal oxide and at the crystal grain boundaries of the metal oxide.

Further, in the composite sintered body of the present embodiment, from the viewpoint of sufficiently improving the insulation properties, the proportion of the crystal grains of the silicon carbide dispersed in the crystal grains of the metal oxide is preferably 40% or more in an area ratio with respect to the total crystal grains of the silicon carbide. The remaining crystal grains of the silicon carbide are present at the crystal grain boundaries of the metal oxide.

In the composite sintered body, the proportion of the "crystal grains of the silicon carbide dispersed in the crystal grains of the metal oxide" to the "total crystal grains of the silicon carbide" is 40% or more in an area ratio, whereby it is possible to sufficiently improve insulation properties. In order to improve the insulation properties, the larger the proportion, the better, and a state where all the crystal grains of the silicon carbide are dispersed in the crystal grains of the aluminum oxide is particularly preferable.

The proportion is 40% or more, whereby the dielectric constant of the composite sintered body becomes high. Further, the proportion is 40% or more, whereby a dielectric loss tangent at a low frequency becomes small.

From the viewpoint of suppressing the generation of particles, the proportion is preferably 30% or more, more preferably 35% or more, and further preferably 40% or more. The proportion is the upper limit value or less, whereby the generation of particles can be suppressed.

In the present invention, the "proportion of the crystal grains of the silicon carbide dispersed in the crystal grains of the metal oxide" in the composite sintered body is calculated from a scanning electron micrograph of any visual field of the composite sintered body.

That is, an electron micrograph at a magnification of 10000 is taken in a randomly selected visual field, and the total area of the crystal grains of the silicon carbide taken in the electron micrograph is regarded as the area of the "total crystal grains of the silicon carbide". On the other hand, in the above electron micrograph, the area of the "crystal grains of the silicon carbide dispersed in the crystal grains of the metal oxide" is determined. From the area determined in this manner, the proportion of the "crystal grains of the silicon carbide dispersed in the crystal grains of the metal oxide" to the "total crystal grains of the silicon carbide" is determined in an area proportion.

The same processing is performed in electron micrographs of two visual fields, and the average value is determined as an area portion representing the "proportion of the crystal grains of the silicon carbide dispersed in the crystal grains of the metal oxide".

The composite sintered body, which is the material for forming the placing plate 11 and the supporting plate 12, has the configuration as described above, whereby the generation of metal fine particles can be suppressed. Furthermore, a high dielectric constant and a high volume resistivity value, that is, a high dielectric constant and a low dielectric loss tangent can be achieved.

In the composite sintered body of the present embodiment, the average crystal grain size of electric conductors (silicon carbide) existing at the crystal grain boundaries where electrons easily move is 0.30 µm or less, which is smaller than that in the related art. In a further preferred embodiment, the average crystal grain size of the silicon carbide dispersed in the crystal grains is 0.20 µm or less, which is smaller than that in the related art.

Here, the metal oxide which is a main phase, among the materials configuring the composite sintered body of the present embodiment, is an insulator, and the silicon carbide which is a sub-phase is an electric conductor. For this reason, if an electric current is tried to flow through the composite sintered body, electrons easily move in the crystal grain boundary and the crystal grain, in which the electric conductors are disposed.

If the silicon carbide having a small average crystal grain size is dispersed in the crystal grain boundaries and crystal grains of the metal oxide in this manner, the distance between the silicon carbide particles, which are electric conductors, becomes short in the crystal grain boundaries and crystal grains, and the electric capacity increases. For this reason, in the composite sintered body as in the present embodiment, the dielectric constant tends to become high.

In SiC (silicon carbide), a large number of crystal structures are known, and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as examples. Among these, the silicon carbide having a 3C type crystal structure is referred to as "β-SiC". Further, all the silicon carbides having crystal structures other than the 3C type crystal structure are referred to as "α-SiC".

In the placing plate 11 and the supporting plate 12 of the present embodiment, it is preferable that SiC which is included in the composite sintered body is β-SiC. Further, in the composite sintered body, it is preferable that the crystal grains of β-SiC are present to be dispersed in a state of being surrounded by the crystal grains of the metal oxide which is a matrix material. In the composite sintered body, the volume ratio of β-SiC can be optionally selected. However, it is preferable that it is 1 volume % or more and 10 volume % or less of the entire composite sintered body. It is more preferably 3% by volume or more and 8% by volume or less, and further preferably 4% by volume or more and 7% by volume or less. However, it is not limited to these. The volume ratio may be 4% by volume or more and 15% by volume or less, or 6% by volume or more and 10% by volume or less.

If the volume ratio of β-SiC is smaller than 1% by volume, there is a case where the expression effect of electron conductivity by SiC particles is small. Further, if the volume ratio of β-SiC is larger than 15% by volume, there is a concern that SiC particles may come into contact with each other to cause a decrease in resistance value through SiC particles.

Further, in the composite sintered body of the present embodiment, the amount of metal impurities which are derived from components other than aluminum and silicon is preferably 100 ppm or less. The amount of metal impurities is preferably 50 ppm or less and more preferably 25 ppm or less.

[Method for Producing Composite Sintered Body]

A method for producing a composite sintered body according to the present embodiment includes:

(a) a step of mixing the metal oxide particles and the silicon carbide particles by introducing the metal oxide particles and the silicon carbide particles together with a dispersive medium into a dispersion (b) stirring mill and causing the metal oxide particles and the silicon carbide to collide with each other to perform pulverization treatment or dispersion treatment;

(b) a step of adjusting pH of slurry obtained in the mixing step to a range in which the surface charges of the metal oxide particles in the slurry become positive and the surface charges of the silicon carbide particles in the slurry become negative;

(c) a step of forming a formed body after a dispersion medium is removed from the slurry with adjusted pH; and (d) a step of pressure-sintering the obtained formed body by heating the formed body to a temperature of 1600° C. or higher while compacting the formed body with a pressure of 25 MPa or more under a non-oxidative atmosphere.

In the present embodiment, with respect to a case where aluminum oxide is used as the metal oxide, a preferred example will be described below.

In the method for producing a composite sintered body according to the present embodiment, it is preferable that the aluminum oxide particles which are used have an aluminum oxide content of 99.99% or more. Such high-purity aluminum oxide particles can be prepared by using an alum method. In the aluminum oxide particles prepared by using the alum method, the content of sodium atoms which are metal impurities can be significantly reduced compared to aluminum oxide particles prepared by using, for example, a Bayer method. Further, as long as aluminum oxide particles having a desired purity can be obtained, various methods can be adopted.

((a) Mixing Step)

In the mixing step, the metal oxide particles and the silicon carbide particles are introduced together with the dispersive medium into a dispersion stirring mill and the metal oxide particles and the silicon carbide are caused to collide with each other to perform pulverization treatment or dispersion treatment, whereby the metal oxide particles and the silicon carbide are mixed. In this way, the aluminum oxide particles and the silicon carbide particles are pulverized, and a dispersion liquid (slurry) containing these pulverized particles is obtained.

In this step, the diameter of a secondary particle formed by aggregation of the particles in the slurry can be optionally selected. However, the diameter is preferably in a range of 0.03 µm or more and 0.50 µm or less, and more preferably in a range of 0.05 µm or more and 0.15 µm or less.

Water such as distilled water, or the like can be added as a dispersion medium to the slurry before pulverization. A dispersant or the like may be added as necessary. The type or amount of the dispersion medium or the dispersant can be selected as necessary.

In the mixing step, it is preferable to perform the mixing together with a dispersive medium in a dispersion stirring mill by mechanical dispersion, and beads dispersion (or beads mill dispersion) using beads as the dispersive medium is more preferable. The amount or type of the dispersive medium can be optionally selected.

As the beads which are used for dispersion, alumina beads, silicon carbide beads, resin beads such as urethane, and the like can be used.

The smaller the diameter of the bead which is used for dispersion, the smaller the average crystal grain size of the silicon carbide dispersed in the crystal grains and at the crystal grain boundaries of the metal oxide can become. In the present embodiment, for example, 0.3 mm or less is preferable, 0.10 mm or less is more preferable, and 0.05 mm or less is further preferable.

As the dispersion stirring mill in the present embodiment, a ball mill, a bead mill, a sand mill, or the like can be given as an example. In the present embodiment, a sand mill is preferred.

In the mixing step, the stirring and mixing conditions vary depending on the type of the bead, the diameter of the bead, the type of the dispersion stirring mill, or the like. For example, in the case of a sand mill, the mixing condition is preferably 500 rpm or more and 6000 rpm or less, and more preferably 1000 rpm or more and 4000 rpm or less. Further, the mixing time can be appropriately adjusted within the range from 3 minutes to 12 hours.

The average crystal grain size of the silicon carbide can be controlled in a finer range by increasing the rotation speed of a stirrer or prolonging the mixing time.

If the amount of the dispersive medium added is increased, the average crystal grain size of the silicon carbide can be controlled within a finer range. Further, the time required for the mixing step can be shortened.

The method for producing a composite sintered body according to the present embodiment may include a step of performing oxidation treatment on the surfaces of the silicon carbide particles in advance by heating the silicon carbide particles to be used, under an oxidizing atmosphere. Hereinafter, the oxidation treatment is referred to as "pre-oxidation". The pre-oxidation is performed, for example, by heating at 500° C. for 12 hours.

By performing the pre-oxidation treatment on the silicon carbide particles, the hydrophilicity of the silicon carbide particles is enhanced. In this way, dispersibility of the silicon carbide particles in the slurry is improved.

((b) Step of Adjusting pH)

In the step of adjusting pH, the pH adjustment is performed in consideration of the surface charges of the aluminum oxide particles and the silicon carbide particles in the slurry. The slurry (slurry before pH adjustment) which is obtained in the mixing step usually exhibits basicity of about pH 11.

The pH of the system is preferably 3 or more and 7 or less, more preferable 5 or more and 7 or less, and further preferable 6 or more and 7 or less. In a case where the z potentials of both particles after the pH adjustment are compared with each other, the closer to each other the absolute values of the z potentials are, the more easily heteroaggregation occurs, and thus a desired aggregation state is obtained.

The pH adjustment is performed by adding an acid to the slurry. As usable acids, inorganic acids such as nitric acid, phosphoric acid, hydrochloric acid, and sulfuric acid, and an organic acid such as acetic acid can be given as examples. Among these, hydrochloric acid, sulfuric acid, or the like generates chlorine or sulfur in an apparatus in the sintering step (described later), which may cause deterioration of the apparatus. For this reason, it is preferable to use nitric acid, phosphoric acid, an organic acid, or the like for the pH adjustment.

The dispersive medium can be separated from the slurry at a suitable timing such as after the step (a) or (b).

((c) Forming Step)

In the forming step, the removal of the dispersion medium and the forming are performed. First, for example, the dispersion liquid after the pH adjustment is spray-dried to obtain granules composed of mixed particles of the aluminum oxide particles and the silicon carbide particles.

Subsequently, the obtained granules are uniaxially formed (formed with uniaxial press) according to the shape of an aimed sintered body.

Subsequently, the obtained formed body is heated to, for example, 500° C. at normal pressure (without applying a press pressure) under an inert gas atmosphere, thereby removing contaminants such as moisture or the dispersion medium, which are included in the formed body. As inert gas, gas which can be optionally selected, preferably, nitrogen or argon can be used. In this operation, as long as the contaminants can be removed from the formed body without modifying the formed body, the heating temperature can be optionally selected and is not limited to 500° C.

Further, it is preferable to include an oxidation step of performing oxidation treatment on the mixed particles configuring the formed body by heating the formed body from which the contaminants have been removed, to a temperature of, for example, 400° C. in the atmosphere. According to such an operation, in the oxidation treatment, oxide films are formed on the surfaces of the silicon carbide particles which are included in the mixed particles. Metal impurities which are included in the mixed particles easily elutes to the oxide film, and therefore, the metal impurities which are included in the mixed particles are present to be biased to the surfaces of the particles. Then, in a pressure-sintering step which will be described later, the metal impurities can be easily removed, which is preferable.

((d) Pressure-Sintering Step)

In the step wherein pressure-calcination is performed, first, the formed body described above is heated (preliminarily heated) to a temperature lower than 1600° C. and at normal pressure (without applying a press pressure) in a vacuum atmosphere (a first non-oxidative atmosphere). According to this operation, by appropriately setting the temperature at the time of the preliminary heating, metal impurities such as alkali metal, which are included in the mixed particles, evaporate, and thus the metal impurities can be easily removed. For this reason, according to such an operation, the purity of the mixed particles is easily improved, and the volume resistance value of the base is easily controlled.

Further, if in the forming step, the oxidation treatment is performed on the formed body from which contaminants have been removed as described above, the oxide film formed on the particle surface is volatilized by performing the preliminary heating under a vacuum atmosphere. At the same time, the metal impurities included in the oxide film evaporate. For this reason, the metal impurities can be easily removed from the formed body. Therefore, according to such an operation, the purity of the mixed particles is easily improved, and the volume resistance value of the base is easily controlled.

In the present embodiment, the term "vacuum" refers to a "state in a space filled with a gas having a pressure lower than the atmospheric pressure" and a state defined as an industrially usable pressure in the JIS standard. In the present embodiment, the vacuum atmosphere may be low vacuum (100 Pa or more). However, medium vacuum (in a range of 0.1 Pa to 100 Pa) is preferable, and high vacuum (in a range of $10^{-5}$ Pa to 0.1 Pa) is more preferable.

In the method for producing a composite sintered body of the present embodiment, for example, after the preliminary heating is performed at 1200° C. for 4 hours or more under a vacuum atmosphere, air pressure is returned to the atmospheric pressure with argon.

Subsequently, the formed body subjected to the preliminary heating is pressure-sintered by heating the formed body to a temperature of 1600° C. or higher while compacting it with a pressure of 5 MPa or more in an argon atmosphere (a second non-oxidative atmosphere). According to such an operation, sintering of the aluminum oxide particles or the silicon carbide particles which are included in the formed body progresses, and thus a dense sintered body having few pores is obtained.

In the method for producing a composite sintered body of the present embodiment, the pressure and the temperature in the pressure-sintering can be optionally selected as long as they are in the ranges described above. For example, the sintering is performed under an argon atmosphere, at a temperature of 1600° C. or higher and 1850° C. or lower and a sintering pressure of 25 MPa or more and 50 MPa or less.

In the sintered body obtained by being produced by such a method, the amount of metal impurity is reduced, and thus the sintered body having high purity is obtained. In a case where the amount of metal impurities does not reach the target value, it is favorable if the preliminary heating time is lengthened or the preliminary heating temperature is increased.

By the above, the composite sintered body of the present embodiment can be produced.

The obtained composite sintered body can be ground in a subsequent step to form a desired base. The projection portions formed on the mounting surface of the base can be appropriately formed by a known method.

According to the composite sintered body as described above, the generation of particles can be suppressed. Further, it is possible to achieve the high dielectric constant and the low dielectric loss tangent.

Further, according to the electrostatic chuck part and the electrostatic chuck device using such a composite sintered body, they can be suitably used in a low frequency region.

Further, according to the method for producing a composite sintered body as described above, the composite sintered body described above can be easily produced.

Further, according to the electrostatic chuck part and the electrostatic chuck device as described above, they have high performance with a high wafer attraction force and a high withstand voltage.

EXAMPLE

Hereinafter, the present invention will be described with examples. However, the present invention is not limited to these examples.

(Volume Resistivity Value)

In this example, the volume resistivity value of a disk-shaped sintered body was measured by a direct-current three-terminal method.

(Used Equipment)

Screen printer: MODEL MEC-2400 type manufactured by Mitani Micronics Co., Ltd.

Resistivity measuring device: manufactured by NISHIYAMA-SEISAKUSHO Co., Ltd.

Insulation meter: digital insulation meter (Model DSM-8103, HIOKI E.E. Corporation)

(Measurement Conditions)

Temperature: room temperature (24° C.), 50° C., 100° C., 150° C., 200° C., 250° C., 300° C.

Atmosphere: nitrogen (purity: 99.99995%, flow rate: 200 ml/min.)

Applied voltage: 0.5 kV, 1 kV (Measurement Method)

Figure 2:
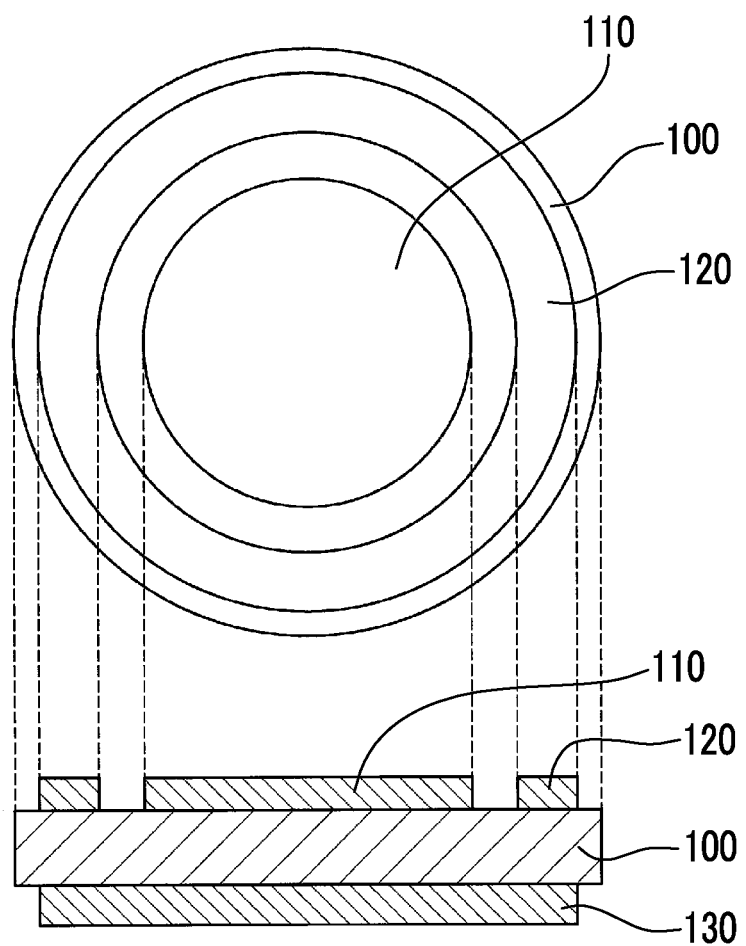
FIG. 2 is a schematic diagram showing a state of a sintered body when measuring a volume resistivity value in an example.

Silver paste (NP-4635 manufactured by Noritake Co., Ltd.) was printed on the upper and lower surfaces of the sintered body by using a screen printer, and dried at 100° C. for 12 hours in the atmosphere. Thereafter, baking was performed at 450° C. for 1 hour in the atmosphere, and a main electrode, a guard electrode, and a counter electrode were formed. FIG. 2 is a schematic diagram showing the state of the sintered body when measuring the volume resistivity value in this example. In the drawing, reference numeral 100 denotes the sintered body, reference numeral 110 denotes the main electrode, reference numeral 120 denotes the guard electrode, and reference numeral 130 denotes the counter electrode.

At this time, the diameter of the main electrode was 1.47 cm, and the inner diameter of the guard electrode was 1.60 cm.

A direct-current voltage was applied to the sintered body with the electrodes formed thereon as described above, at each measurement temperature, and an electric current after charging for 1 minute was measured to obtain the volume resistance of the sintered body. Thereafter, a volume resistivity value (ρv) was calculated from the following expression (1) by using the thickness of the sintered body and the area of the electrode.

$$\rho v = S/t \times Rv = S/t \times V/I \quad (1)$$

(S: effective area (cm$^2$) of an electrode, t: thickness (cm) of a sintered body, Rv: volume resistance, V: direct-current voltage (V), I: electric current (A))

(Relative Dielectric Constant and Dielectric Loss Tangent)

In this example, a relative dielectric constant and a dielectric loss tangent were measured by a parallel plate method using a precision impedance analyzer (model number: 4294A, manufactured by Agilent Technologies) and a dielectric test fixture (model number: 16451B, manufactured by Agilent Technologies).

(Withstand Voltage)

In this example, the sintered body is sandwiched between cylindrical electrodes each having a diameter of 20 mm was measured by using a high-voltage power supply (model HGR10-20P, manufactured by Matsuda Precision Co., Ltd.). Thereafter, a voltage (withstand voltage) at which an electric current of 1 µA flows through a test piece which is a sintered body when voltage is applied at a rate of temperature rise of 1 kV/sec in silicone oil at room temperature was measured.

(Average Crystal Grain Size of Metal Oxide and Average Crystal Grain Size of Silicon Carbide)

In this example, the surface of a composite oxide (a sintered body) was mirror-polished with a diamond paste of 3 µm. Thereafter, thermal etching was performed at 1400° C. for 30 minutes under an argon atmosphere.

The surface of the obtained sintered body was subjected to structure observation at a magnification of 10000 by using a scanning electron microscope (model number: S-4000, manufactured by Hitachi High-Technologies Corporation).

The obtained electron micrograph was incorporated into image analysis type particle size distribution measurement software (Mac-View Version 4) and the area of 200 or more silicon carbide particles was calculated. From the electron micrograph, whether or not each silicon carbide particle is present in the crystal grain of the metal oxide was determined, and the proportion of the crystal grains of the silicon carbide dispersed in the crystal grains of the metal oxide to the total silicon carbide particles from which the area was calculated was determined.

The electron micrograph was incorporated into image analysis type particle size distribution measurement software (Mac-View Version 4) and the major axis diameters of 200 or more metal oxide crystal grains in the crystal grains and at the crystal grain boundaries of the metal oxide, respectively, were calculated. The arithmetic average value of the obtained major axis diameters of the crystal grains (particle diameter D50 in which a cumulative volume percentage in the volume particle size distribution of SiC particles is 50% by volume) was defined as the "average crystal grain size" to be obtained.

Further, a particle diameter D10 in which a cumulative volume percentage in the volume particle size distribution of SiC particles in a composite sintered body is 10% by volume, and a particle diameter D90 in which a cumulative volume percentage in the volume particle size distribution of SiC particles is 90% by volume were obtained.

(Measurement of Metal Impurity (Particle) Generation Ratio)

In this example, the value measured by the ICP-MS method was adopted as the amount of metal impurities.

In the measurement, both the raw material and the sintered body were dissolved in an acid having an appropriate concentration, and then impurities were quantified using ICP-MS.

The metal impurity generation ratios (particle generation ratios) in Example 1 and Comparative Example 1 in a case where the amount of metal impurities in Comparative Example 2 was set to be 1 were calculated.

Example 1

As a starting material, β-SiC type silicon carbide (β-SiC) particles having an average particle diameter of 0.03 μm and synthesized by thermal plasma CVD, and aluminum oxide ($Al_2O_3$) particles having an average particle diameter of 0.1 μm and the amount of metal impurity of 95 ppm were used.

With respect to the β-SiC particles, the particle surface was oxidized by performing heating treatment at 500° C. for 12 hours under the air atmosphere. Hereinafter, the oxidation treatment is referred to as "pre-oxidation". In the following steps, β-SiC subjected to the pre-oxidation treatment was used.

Weighing was performed such that the β-SiC particles are 5% by mass with respect to the total amount of the β-SiC particles and the $Al_2O_3$ particles, and the β-SiC particles and the $Al_2O_3$ particles were introduced into distilled water containing a dispersant. The dispersion liquid with the β-SiC particles and the $Al_2O_3$ particles put therein was subjected to dispersion treatment by an ultrasonic dispersing device and then pulverized and mixed by using a sand mill. As a result, slurry was obtained.

The following beads were used in the pulverizing and mixing step using a sand mill.
Material: alumina beads
Grain size: φ0.1 mm
Rotation: 2500 rpm
Time: 2 hours This operation corresponds to the "mixing step" in the present invention.

With respect to the obtained mixed solution (slurry), nitric acid was added to the slurry to adjust pH of the slurry to 6.5.

This operation corresponds to the "step of adjusting pH" in the present invention.

The slurry with adjusted pH was spray-dried by a spray dryer to obtain mixed particles of β-SiC and $Al_2O_3$.

This operation corresponds to apart of the "forming step" in the present invention.

Subsequently, the mixed particles were heated to 370° C. under a nitrogen atmosphere to remove moisture and the dispersant (contaminants).

The mixed particles were subjected to uniaxial press forming at a press pressure of 8 MPa to obtain a formed body having a diameter of 320 mm and a thickness of 15 mm.

This operation corresponds to a part of the "forming step" in the present invention.

The obtained formed body was set in a graphite mold and pressure-sintering was performed. First, the formed body was heated to 1200° C. under a vacuum atmosphere without applying a press pressure thereto. Thereafter, sintering was performed at a press pressure of 40 MPa and a temperature of 1800° C. under an argon atmosphere to obtain a composite sintered body of Example 1.

This operation corresponds to the "pressure-sintering step" in the present invention.

Further, an electron micrograph of the composite sintered body of Example 1 was taken under the conditions described above.

When the average crystal grain size of $Al_2O_3$ was determined from the obtained electron micrograph, the average crystal grain size was 1.31 μm. Further, when the average crystal grain size of SiC was determined, the average crystal grain size was 0.15 μm.

The proportion of the crystal grains of SiC dispersed in the crystal grains of $Al_2O_3$ was 48%.

Comparative Example 1

A composite sintered body of Comparative Example 1 was obtained by the same method as in Example 1 except that in the mixing step, after dispersion treatment with an ultrasonic dispersing device, pulverizing and mixing treatment was performed using a two-stream particle collision type pulverizing and mixing device (ultimizer).

An electron micrograph of the composite sintered body of Comparative Example 1 was taken under the conditions described above. When the average crystal grain size of $Al_2O_3$ was determined from the obtained electron micrograph, the average crystal grain size was 1.44 μm.

Further, when the average crystal grain size of SiC was determined, the average crystal grain size was 0.18 μm.

The proportion of the crystal grains of SiC dispersed in the crystal grains of $Al_2O_3$ was 35%.

Comparative Example 2

A raw material was weighed such that the β-SiC particles are 8.5% by mass with respect to the total amount of the β-SiC particles and the $Al_2O_3$ particles, and after the dispersion treatment with an ultrasonic dispersing device, the raw material was pulverized and mixed by using a two-stream particle collision type pulverizing and mixing device.

With respect to the obtained mixed solution, nitric acid was added to slurry to adjust pH of the slurry to 6.5.

The slurry with adjusted pH was spray-dried by a spray dryer to obtain mixed particles of β-SiC and Al₂O₃.

The mixed particles were subjected to uniaxial press forming at a press pressure of 8 MPa to obtain a formed body having a diameter of 320 mm and a thickness of 15 mm.

Subsequently, the formed body was heated to 370° C. under a nitrogen atmosphere without applying a press pressure thereto to remove moisture and the dispersant (contaminants). Thereafter, the formed body with the contaminants removed therefrom was heated to 370° C. in the atmosphere to oxidize the surfaces of the β-SiC particles which are included in the formed body.

The obtained formed body was sintered in the same manner as in Example 1 to obtain a composite sintered body of Comparative Example 2.

An electron micrograph of the composite sintered body of Comparative Example 2 was taken under the conditions described above. When the average crystal grain size of Al₂O₃ was determined from the obtained electron micrograph, the average crystal grain size was 0.94 μm.

Further, when the average crystal grain size of SiC was determined, the average crystal grain size was 0.34 μm.

The proportion of the crystal grains of SiC dispersed in the crystal grains of Al₂O₃ was 14%.

Comparative Example 3

A raw material was weighed such that the β-SiC particles are 8.5% by mass with respect to the total amount of the β-SiC particles and the Al₂O₃ particles, and was put in distilled water containing a dispersant. The dispersion liquid with the β-SiC particles and the Al₂O₃ particles put therein was subjected to dispersion treatment by an ultrasonic dispersing device and then pulverized and mixed by using a sand mill.

The following beads were used in the pulverizing and mixing step using a sand mill.
Material: alumina beads
Grain size: ϕ0.1 mm
Rotation: 2500 rpm
Time: 2 hours With respect to the obtained mixed solution, nitric acid was added to slurry to adjust pH of the slurry to 11.

The slurry with adjusted pH was spray-dried by a spray dryer to obtain mixed particles of β-SiC and Al₂O₃.

The mixed particles were subjected to uniaxial press forming at a press pressure of 8 MPa to obtain a formed body having a diameter of 320 mm and a thickness of 15 mm.

Subsequently, the formed body was heated to 370° C. under a nitrogen atmosphere without applying a press pressure thereto to remove moisture and the dispersant (contaminants). Thereafter, the formed body with the contaminants removed therefrom was heated to 370° C. in the atmosphere to oxidize the surfaces of the β-SiC particles which are included in the formed body.

The obtained formed body was sintered in the same manner as in Example 1 to obtain a composite sintered body of Comparative Example 3.

With respect to the sintered body of Comparative Example 3, volume resistivity, dielectric constant, dielectric loss tangent, and withstand voltage were measured. The results are shown in Table 2. In Comparative Example 3, dispersibility was poor, and in the sintered body, these results were worse than those in Example 1. Therefore, the observation of the structure of the sintered body was not carried out.

TABLE 1

|  | Mixing device | Slurry pH | Pre-oxidation treatment temperature/° C. | Main oxidation treatment temperature/° C. | SiC addition amount/% by mass |
|---|---|---|---|---|---|
| Example 1 | Sand mill | 6.5 | 500 | — | 5 |
| Comparative Example 1 | Ultimizer | 6.5 | 500 | — | 5 |
| Comparative Example 2 | Ultimizer | 6.5 | — | 370 | 8.5 |
| Comparative Example 3 | Sand mill | 11 | — | 370 | 8.5 |

TABLE 2

| | Sintered body physical properties | | | |
|---|---|---|---|---|
| | | Dielectric characteristics: 1 kHz | | |
| | Volume resistivity/ Ω · cm | Dielectric constant | Dielectric loss tangent | Withstand voltage/ kV, 0.5 mm |
| Example 1 | 5.7E+15 | 13.1 | 0.0004 | 20 |
| Comparative Example 1 | 8.0E+15 | 13.1 | 0.0011 | 20 |
| Comparative Example 2 | 4.0E+15 | 12.6 | 0.0071 | 15 |
| Comparative Example 3 | 7.5E+15 | 19.1 | 0.0658 | 4 |

TABLE 3

| | Al2O3 grain size/μm | Grain size of SiC at grain boundary/μm | | | Grain size of SiC in grain/μm | | | Dispersion ratio of SiC in grain/% | Particle generation ratio |
|---|---|---|---|---|---|---|---|---|---|
| | | D10 | D50 | D90 | D10 | D50 | D90 | | |
| Example 1 | 1.31 | 0.17 | 0.28 | 0.47 | 0.09 | 0.17 | 0.28 | 48 | 0.5 |
| Comparative Example 1 | 1.44 | 0.18 | 0.32 | 0.55 | 0.09 | 0.18 | 0.31 | 35 | 0.7 |
| Comparative Example 2 | 0.94 | 0.24 | 0.43 | 0.67 | 0.1 | 0.22 | 0.35 | 14 | 1 |
| Comparative Example 3 | 2.41 | — | — | — | — | — | — | — | — |

As shown in the above results, Example 1 to which the present invention was applied had a lower particle generation ratio than in Comparative Example 1.

INDUSTRIAL APPLICABILITY

It is possible to provide a composite sintered body for an electrostatic chuck in which generation of particles is suppressed.

REFERENCE SIGNS LIST

1: electrostatic chuck device
2: electrostatic chuck part
3: temperature adjusting base part
3A: flow path
3b: through-hole
4: adhesion layer
5: heater element
6: adhesion layer
7: insulating plate
8: adhesive layer
10: focus ring
11: placing plate (base)
11a: mounting surface
11b: projection portion
12: supporting plate (base)
13: electrostatic attraction electrode
14: insulating material layer
15: power supply terminal
15a: insulator
16: through-hole
17: power supply terminal
18: tubular insulator
19: groove
20: temperature sensor
21: installation hole
22: temperature measurement part
23: excitation unit
24: fluorescence detector
28: gas hole
29: tubular insulator
100: sintered body
110: main electrode
120: guard electrode
130: counter electrode
W: plate-shaped sample

The invention claimed is:

1. A ceramic composite sintered body, comprising:
a metal oxide as a main phase; and
silicon carbide as a sub-phase,
wherein crystal grains of the silicon carbide are dispersed in crystal grains of the metal oxide and at crystal grain boundaries of the metal oxide, and
an average crystal grain size (D50) of the silicon carbide dispersed which are at the crystal grain boundaries of the metal oxide is 0.30 μm or less; and
a proportion of the crystal grains of the silicon carbide which are dispersed in the crystal grains of the metal oxide is 40% or more in an area ratio, based on total crystal grains of the silicon carbide.

2. The composite sintered body according to claim 1, wherein an average crystal grain size (D50) of the silicon carbide dispersed in the crystal grains of the metal oxide is 0.20 μm or less.

3. The composite sintered body according to claim 1, wherein the metal oxide is aluminum oxide or yttrium oxide.

4. The composite sintered body according to claim 1, wherein an average crystal grain size of the metal oxide is 1.2 μm or more and 10 μm or less.

5. An electrostatic chuck member comprising:
a plate-shaped base made of the composite sintered body according to claim 1, which is used as a forming material, wherein the plate-shaped base has one main surface serving as a mounting surface on which a plate-shaped sample is mounted; and
an electrostatic attraction electrode provided on a side opposite to the mounting surface of the base, or in an inside of the base.

6. An electrostatic chuck device comprising:
the electrostatic chuck member according to claim 5.

7. A method for producing a ceramic composite sintered body according to claim 1, comprising:
a step of oxidizing a surface of a silicon carbide particle,
a step of mixing metal oxide particles, the silicon carbide particles, and a dispersion medium;
a step of adjusting pH of slurry obtained in the mixing step to a range in which surface charges of the metal oxide particles in the slurry is positive and surface charges of the silicon carbide particles in the slurry is negative;
a step of forming a formed body after removing the dispersion medium from the slurry having the adjusted pH; and
a step of pressure-sintering the obtained formed body by heating the formed body to a temperature of 1600° C. or higher while compacting the formed body at a pressure of 25 MPa or more under a non-oxidative atmosphere,
wherein the mixing step is a step of charging the metal oxide particles, the silicon carbide particles, the dispersion medium and a dispersive medium in a dispersion stirring mill and mixing them.

8. The method for producing a composite sintered body according to claim 7, wherein in the pH adjusting step, the pH of the slurry is adjusted to 5 or more and 7 or less.

9. The method for producing a composite sintered body according to claim 7, wherein a metal oxide content of the metal oxide particles is 99.99% or more.

10. The method for producing a composite sintered body according to claim 7, wherein the dispersive medium is beads, and
   the beads are removed from the slurry, before the step of forming a formed body is performed.

* * * * *